(12) United States Patent
Yang et al.

(10) Patent No.: US 10,097,142 B2
(45) Date of Patent: *Oct. 9, 2018

(54) POWER AMPLIFIER TIME-DELAY INVARIANT PREDISTORTION METHODS AND APPARATUS

(71) Applicant: Dali Wireless, Inc., Menlo Park, CA (US)

(72) Inventors: Dali Yang, Mountain View, CA (US); Jia Yang, Mountain View, CA (US)

(73) Assignee: Dali Wireless, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/788,567

(22) Filed: Jun. 30, 2015

(65) Prior Publication Data
US 2016/0036394 A1    Feb. 4, 2016

Related U.S. Application Data

(63) Continuation of application No. 13/724,157, filed on Dec. 21, 2012, now Pat. No. 9,077,297, which is a
(Continued)

(51) Int. Cl.
*H04B 1/04* (2006.01)
*H03F 1/32* (2006.01)
(Continued)

(52) U.S. Cl.
CPC ......... *H03F 1/3247* (2013.01); *H03F 1/3241* (2013.01); *H03F 3/24* (2013.01);
(Continued)

(58) Field of Classification Search
CPC ........... H03F 1/3217; H03F 2201/3224; H04B 2001/0425; H04B 1/62; H04B 2001/0043
(Continued)

(56) References Cited

U.S. PATENT DOCUMENTS 4,638,248 A    1/1987  Schweickert
4,700,151 A   10/1987  Nagata
(Continued)

FOREIGN PATENT DOCUMENTS

WO    2008/105775 A1    9/2008

OTHER PUBLICATIONS

Non-Final Office Action for U.S. Appl. No. 12/021,241 dated Apr. 15, 2009, 18 pages.
(Continued)

*Primary Examiner* — Tuan Pham
(74) *Attorney, Agent, or Firm* — Kilpatrick Townsend & Stockton LLP

(57) ABSTRACT

An embodiment of the invention is a time-delay invariant predistortion approach to linearize power amplifiers in wireless RF transmitters. The predistortion architecture is based on the stored-compensation or memory-compensation principle by using a combined time-delay addressing method, and therefore, the architecture has an intrinsic, self-calibrating time-delay compensation function. The predistortion architecture only uses a lookup table to conduct both the correction of non-linear responses of a power amplifier and the compensation of any time-delay effects presented in the same system. Due to the time-delay invariant characteristic, the predistortion design has a wider dynamic range processing advantage for wireless RF signals, and therefore can be implemented in multi-carrier and multi-channel wireless systems.

20 Claims, 3 Drawing Sheets

Related U.S. Application Data continuation of application No. 12/021,241, filed on Jan. 28, 2008, now Pat. No. 8,380,143, which is a continuation-in-part of application No. 11/262,079, filed on Oct. 27, 2005, now Pat. No. 8,326,238, which is a continuation of application No. 10/137,556, filed on May 1, 2002, now Pat. No. 6,985,704.

(60) Provisional application No. 60/898,312, filed on Jan. 29, 2007, provisional application No. 60/897,746, filed on Jan. 26, 2007.

(51) Int. Cl.
    *H03F 3/24* (2006.01)
    *H04L 1/00* (2006.01)

(52) U.S. Cl.
    CPC ......... *H04B 1/0475* (2013.01); *H04L 1/0044* (2013.01); *H03F 2200/451* (2013.01); *H03F 2200/57* (2013.01); *H03F 2201/3224* (2013.01); *H03F 2201/3233* (2013.01); *H04B 2001/0425* (2013.01)

(58) Field of Classification Search
    USPC ......... 455/24, 91, 69, 73, 114.3, 115.1, 126; 375/295, 296, 297, 298; 330/149, 260
    See application file for complete search history.

(56) References Cited

U.S. PATENT DOCUMENTS

| | | |
|---|---|---|
| 4,890,300 A | 12/1989 | Andrews |
| 4,929,906 A | 5/1990 | Voyce et al. |
| 5,049,832 A | 9/1991 | Cavers |
| 5,105,445 A | 4/1992 | Karam et al. |
| 5,107,520 A | 4/1992 | Karam et al. |
| 5,121,412 A | 5/1992 | Borth |
| 5,132,639 A | 7/1992 | Blauvelt et al. |
| 5,396,190 A | 3/1995 | Murata |
| 5,486,789 A | 1/1996 | Palandech et al. |
| 5,579,342 A | 11/1996 | Crozier |
| 5,589,797 A | 12/1996 | Gans et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,740,520 A | 4/1998 | Cyze et al. |
| 5,757,229 A | 5/1998 | Mitzlaff |
| 5,786,728 A | 7/1998 | Alinikula |
| 5,870,668 A | 2/1999 | Takano et al. |
| 5,920,808 A | 7/1999 | Jones et al. |
| 5,923,712 A | 7/1999 | Leyendecker |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,959,500 A | 9/1999 | Garrido |
| 5,963,549 A | 10/1999 | Perkins et al. |
| 6,054,896 A | 4/2000 | Wright et al. |
| 6,055,418 A | 4/2000 | Harris et al. |
| 6,081,158 A | 6/2000 | Twitchell et al. |
| 6,091,941 A | 7/2000 | Moriyama et al. |
| 6,236,267 B1 | 5/2001 | Anzil |
| 6,240,144 B1 * | 5/2001 | Ha .......... H03D 7/168 330/149 |
| 6,242,979 B1 | 6/2001 | Li |
| 6,246,286 B1 | 6/2001 | Persson |
| 6,246,865 B1 | 6/2001 | Lee |
| 6,252,912 B1 | 6/2001 | Salinger |
| 6,275,685 B1 | 8/2001 | Wessel et al. |
| 6,301,579 B1 | 10/2001 | Becker |
| 6,313,703 B1 | 11/2001 | Wright et al. |
| 6,314,142 B1 | 11/2001 | Perthold et al. |
| 6,320,463 B1 | 11/2001 | Leva et al. |
| 6,356,555 B1 | 3/2002 | Rakib et al. |
| 6,373,902 B1 | 4/2002 | Park et al. |
| 6,388,518 B1 | 5/2002 | Miyataini |
| 6,400,774 B1 | 6/2002 | Matsuoka et al. |
| 6,424,225 B1 | 7/2002 | Choi et al. |
| 6,489,846 B2 | 12/2002 | Hatsugai |
| 6,512,417 B2 | 1/2003 | Booth et al. |
| 6,552,634 B1 | 4/2003 | Raab |
| 6,587,514 B1 | 7/2003 | Wright et al. |
| 6,591,090 B1 | 7/2003 | Lilja et al. |
| 6,600,792 B2 | 7/2003 | Ha |
| 6,614,854 B1 | 9/2003 | Chow et al. |
| 6,625,429 B1 | 9/2003 | Yamashita |
| 6,639,050 B1 | 10/2003 | Kieliszewski |
| 6,677,870 B2 | 1/2004 | Im et al. |
| 6,697,436 B1 | 2/2004 | Wright et al. |
| 6,703,897 B2 | 3/2004 | O'Falherty et al. |
| 6,741,663 B1 | 5/2004 | Tapio et al. |
| 6,741,867 B1 | 5/2004 | Tetsuya |
| 6,747,649 B1 | 6/2004 | Sanz-Pastor et al. |
| 6,751,447 B1 | 6/2004 | Jin et al. |
| 6,885,241 B2 | 4/2005 | Huang et al. |
| 6,898,252 B1 | 5/2005 | Yellin |
| 6,907,085 B2 | 6/2005 | Kubo et al. |
| 6,963,242 B2 | 11/2005 | White et al. |
| 6,973,139 B2 | 12/2005 | Ahn et al. |
| 6,983,025 B2 | 1/2006 | Schell |
| 6,985,704 B2 | 1/2006 | Yang et al. |
| 6,998,909 B1 | 2/2006 | Mauer |
| 7,023,273 B2 | 4/2006 | Johnson et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,071,777 B2 | 7/2006 | McBeath et al. |
| 7,079,818 B2 | 7/2006 | Khorram |
| 7,098,734 B2 | 8/2006 | Hongo et al. |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffei |
| 7,109,998 B2 | 9/2006 | Smith |
| 7,123,890 B2 | 10/2006 | Kenington et al. |
| 7,151,913 B2 | 12/2006 | Ahmed |
| 7,158,765 B2 | 1/2007 | Blair et al. |
| 7,190,222 B2 | 3/2007 | Okazaki et al. |
| 7,193,472 B2 | 3/2007 | Gotou et al. |
| 7,248,642 B1 | 7/2007 | Vella-Coleiro |
| 7,259,630 B2 | 8/2007 | Bachman et al. |
| 7,321,635 B2 | 1/2008 | Osenasek et al. |
| 7,321,636 B2 | 1/2008 | Harel et al. |
| 7,372,918 B2 | 5/2008 | Muller et al. |
| 7,469,491 B2 | 12/2008 | McCallister et al. |
| 7,831,221 B2 * | 11/2010 | Leffel .......... H03F 1/3288 375/297 |
| RE42,287 E | 4/2011 | Apodaca et al. |
| 8,064,850 B2 | 11/2011 | Yang et al. |
| 8,326,238 B2 | 12/2012 | Yang et al. |
| 8,380,143 B2 | 2/2013 | Yang et al. |
| 8,472,897 B1 | 6/2013 | Yang et al. |
| 8,620,234 B2 | 12/2013 | Yang et al. |
| 8,731,495 B2 | 5/2014 | Yang et al. |
| 9,031,521 B2 | 5/2015 | Yang et al. |
| 9,054,758 B2 | 6/2015 | Yang et al. |
| 9,077,297 B2 | 7/2015 | Yang et al. |
| 2001/0051504 A1 | 12/2001 | Kubo et al. |
| 2002/0025790 A1 | 2/2002 | Matsuoka |
| 2002/0034260 A1 | 3/2002 | Kim |
| 2002/0044014 A1 | 4/2002 | Wright et al. |
| 2002/0080891 A1 | 6/2002 | Ahn et al. |
| 2002/0101937 A1 | 8/2002 | Antonio et al. |
| 2002/0101938 A1 | 8/2002 | Horaguchi et al. |
| 2002/0186783 A1 | 12/2002 | Opas et al. |
| 2002/0187761 A1 | 12/2002 | Im et al. |
| 2002/0191710 A1 * | 12/2002 | Jeckeln .......... H03F 1/3247 375/296 |
| 2002/0193085 A1 | 12/2002 | Mathe et al. |

(56) References Cited

U.S. PATENT DOCUMENTS

| | | |
|---|---|---|
| 2002/0193087 A1 | 12/2002 | Kim |
| 2003/0035494 A1 | 2/2003 | Bauder et al. |
| 2003/0058959 A1 | 3/2003 | Rafie et al. |
| 2003/0095608 A1 | 5/2003 | Dupperray |
| 2003/0098752 A1 | 5/2003 | Haghighat |
| 2003/0112068 A1 | 6/2003 | Kenington |
| 2003/0179829 A1 | 9/2003 | Pinckley et al. |
| 2003/0179830 A1 | 9/2003 | Eidson et al. |
| 2004/0017859 A1 | 1/2004 | Sills et al. |
| 2004/0142667 A1 | 7/2004 | Lochhead et al. |
| 2004/0180634 A1 | 9/2004 | Kenington et al. |
| 2004/0240585 A1 | 12/2004 | Bishop et al. |
| 2005/0079834 A1 | 4/2005 | Maniwa et al. |
| 2005/0159117 A1 | 7/2005 | Bausov et al. |
| 2005/0226346 A1 | 10/2005 | Ode et al. |
| 2005/0253652 A1 | 11/2005 | Song et al. |
| 2005/0262498 A1 | 11/2005 | Ferguson et al. |
| 2006/0012426 A1 | 1/2006 | Nezami |
| 2006/0067426 A1 | 3/2006 | Maltsev et al. |
| 2006/0109052 A1 | 5/2006 | Saed et al. |
| 2006/0121858 A1 | 6/2006 | Tanaka et al. |
| 2006/0217083 A1 | 9/2006 | Bratthwaite |
| 2006/0226903 A1 | 10/2006 | Muller et al. |
| 2006/0238245 A1 | 10/2006 | Carichner et al. |
| 2006/0240786 A1 | 10/2006 | Liu |
| 2006/0270366 A1 | 11/2006 | Rozenblit et al. |
| 2007/0075780 A1 | 4/2007 | Krvavac et al. |
| 2007/0171234 A1 | 7/2007 | Crawfis et al. |
| 2007/0190952 A1 | 8/2007 | Waheed et al. |
| 2007/0241812 A1 | 10/2007 | Yang |
| 2007/0273439 A1* | 11/2007 | Lin ................... H03F 1/3247 330/136 |
| 2015/0326349 A1 | 11/2015 | Yang et al. |
| 2015/0333710 A1 | 11/2015 | Yang et al. |
| 2017/0033969 A1 | 2/2017 | Yang et al. |

OTHER PUBLICATIONS

Non-Final Office Action for U.S. Appl. No. 12/021,241 dated Dec. 18, 2009, 15 pages.
Final Office Action for U.S. Appl. No. 12/021,241 dated Sep. 21, 2010, 14 pages.
Non-Final Office Action for U.S. Appl. No. 12/021,241 dated Feb. 15, 2012, 16 pages.
Notice of Allowance for U.S. Appl. No. 12/021,241 dated Sep. 25, 2012, 16 pages.
Notice of Allowance for U.S. Appl. No. 13/724,157 dated Mar. 10, 2015, 10 pages.
Non-Final Office Action for U.S. Appl. No. 13/724,157 dated Oct. 10, 2014, 7 pages.
Hilborn et al., "An Adaptive Direct Conversion Transmitter", IEEE Trans. on Vehicular Technology, vol. 43, No. 2 May 1994, pp. 223-233.
Faukner et al., "Adaptive Linearization Using Predistortion—Experimental Results", IEEE Trans. on Vehicular Technology, vol. 43, No. 2, May 1994, pp. 323-332.
Cavers, "Adaptive Behavior of a Feed-Forward Amplifier Linearizer", IEEE Trans. on Vehicular Technology, vol. 44, No. 1, Feb. 1995, pp. 31-40.
Eun et al., "A New Volterra Predistorter Based on the Indirect Learning Architecture", Jan. 1997, IEEE Transactions on Signal Processing 223-227.
Cavers, "Amplifier Linearization Using Digital Predistorter With Fast Adaptation and Low Memory Requirements", IEEE Trans. on Vehicular Technology, vol. 39, No. 4, Nov. 1990, pp. 374-382.
Nagata, "Linear Amplification Technique for Digital Mobile Communications", in Proc. 39th IEEE Vehicular Technology Conference, San Francisco, CA 1989, pp. 159-165.
Bernardini et al., "Analysis of Different Optimization Criteria for IF Predistortion in Digital Radio Links With Nonlinear Amplifiers", IEEE Trans. on Communications, vol. 45, No. 4, Apr. 1997.
Santella, "Performance of Adaptive Predistorters in Presence of Orthogonal Multicarrier Modulation", International Conference on Telecommunications, pp. 621-626, Melbourne, Australia, Apr. 2-5, 1997.
Office Action for related Chinese patent application No. 200780023875.1 dated Dec. 23, 2011, 6 pages.
First Office Action for related Chinese patent application No. 200880003130.3 dated Aug. 5, 2011, 8 pages.
Second Office Action for related Chinese patent application No. 200880003130.3 dated May 3, 2012, 10 pages.
Third Office Action for related Chinese patent application No. 200880003130.3 dated Jan. 11, 2013, 13 pages.
Fourth Office Action and English Translation for related Chinese patent application No. 200880003130.3 dated Jul. 8, 2013, 9 pages.
Fifth Office Action and English Translation for related Chinese patent application No. 200880003130.3 dated Dec. 24, 2013, 8 pages.

* cited by examiner

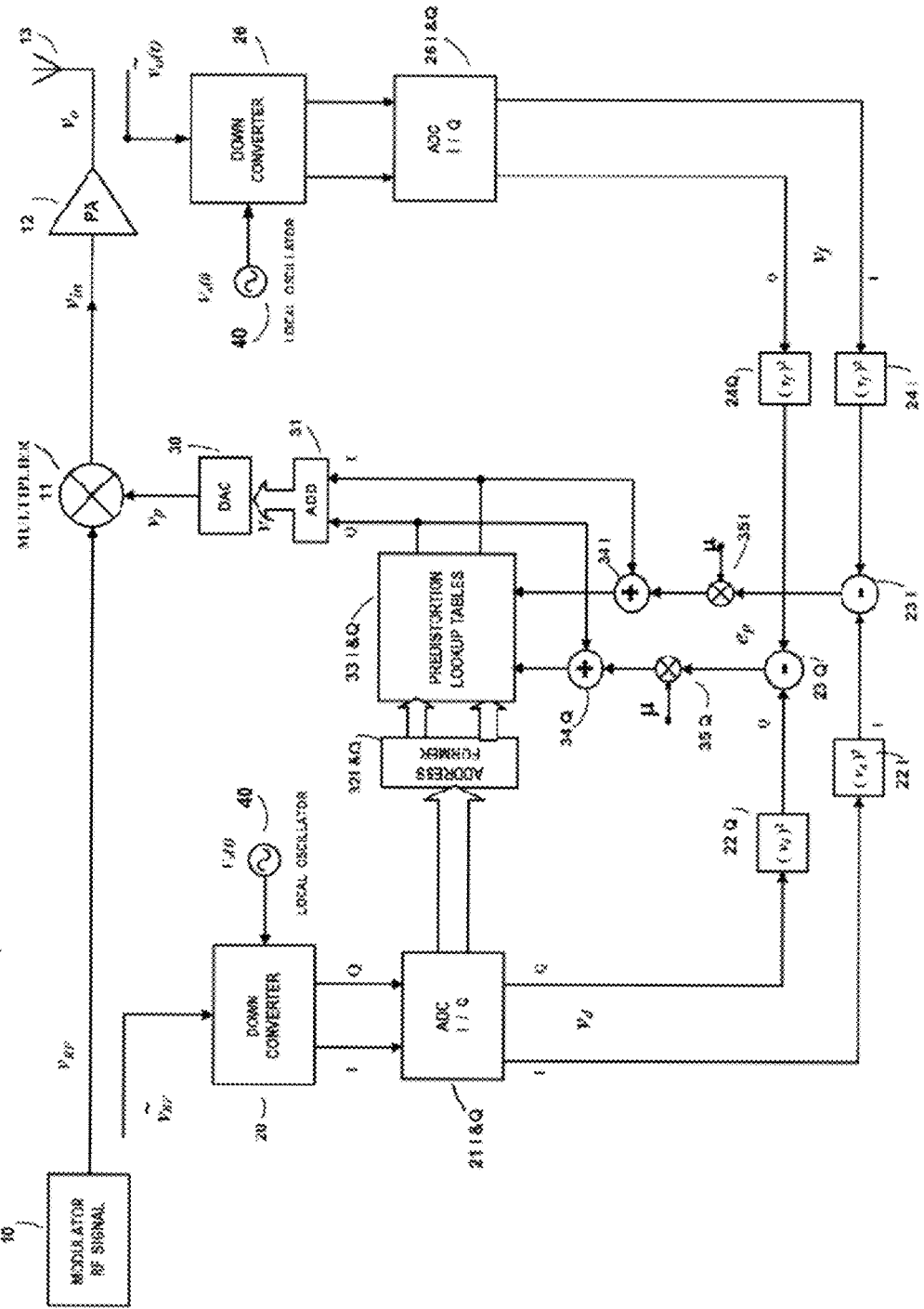
FIGURE 1 The predistortion architecture

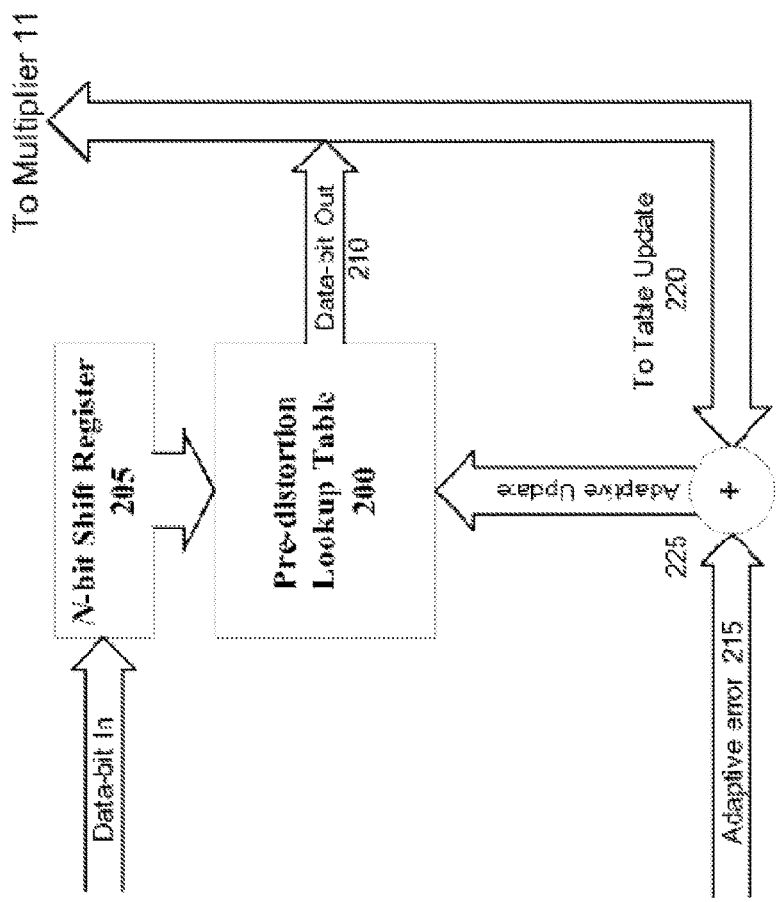
FIGURE 2  The combined time-delay lookup table for predistortion and time-delay compensation

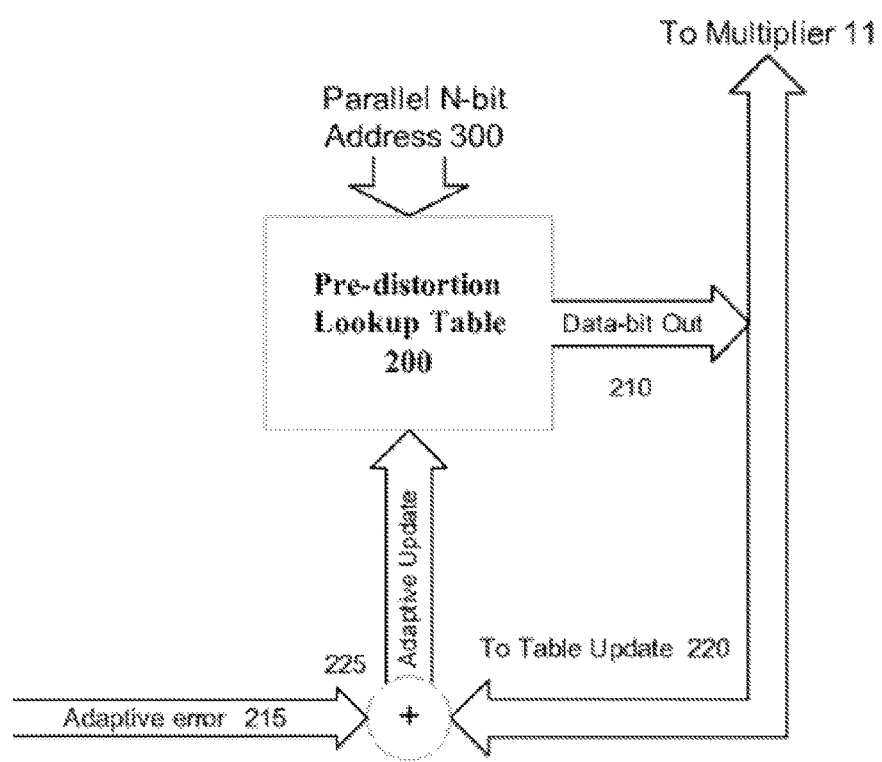
FIGURE 3  The combined time-delay lookup table for predistortion and time-delay compensation using parallel addressing

POWER AMPLIFIER TIME-DELAY INVARIANT PREDISTORTION METHODS AND APPARATUS

CROSS-REFERENCES TO RELATED APPLICATIONS

This application is a continuation application of U.S. patent application Ser. No. 13/724,157, filed Dec. 21, 2012 which is a continuation application of U.S. patent application Ser. No. 12/021,241, filed Jan. 28, 2008, titled, "Power Amplifier Time-Delay Invariant Predistortion Methods and Apparatus," which in turn is a continuation-in-part of U.S. patent application Ser. No. 11/262,079, filed Oct. 27, 2005, titled "System and Method for Digital Memorized Predistortion for Wireless Communication" and also claims the benefit of U.S. Provisional Patent Application No. 60/897,746, filed Jan. 26, 2007, titled "Power Amplifier Time-Delay Invariant Predistortion Methods and Apparatus," and U.S. Provisional Patent Application No. 60/898,312, filed Jan. 29, 2007, titled "Power Amplifier Time-Delay Invariant Predistortion Methods and Apparatus," the continuation-in-part Ser. No. 11/262,079 of which in turn is a continuation of U.S. patent application Ser. No. 10/137,556, filed May 1, 2002, now U.S. Pat. No. 6,985,704, issued Jan. 10, 2006 titled "System and Method for Digital Memorized Predistortion for Wireless Communication," all of which are incorporated by reference in their entirety for all purposes. This application also incorporates by reference U.S. patent application Ser. No. 11/799,239, filed Apr. 30, 2007 and its parent U.S. Provisional Patent Application No. 60/795,820, filed Apr. 28, 2006, titled "High Efficiency Linearization Power Amplifier For Wireless Communication"; related non provisional U.S. patent application Ser. No. 11/962,025, filed Dec. 20, 2007, titled "Power Amplifier Predistortion Methods and Apparatus;" and its parent U.S. Provisional Patent Application No. 60/876,640, filed Dec. 22, 2006, titled "Power Amplifier Predistortion Methods and Apparatus."

FIELD OF THE INVENTION

The present invention relates systems and methods for using predistortion to linearize the output of a power amplifier (PA), such as those used in wireless transmission systems. More particularly, the present invention uses an adaptive time-delay adjusting methodology to correct the PA's nonlinearity. More particularly, the invention relates to systems and methods which use a time-delay invariant predistortion architecture to linearize the output of a power amplifier (PA) in wireless transmission systems.

BACKGROUND OF THE INVENTION

In a typical prior art predistortion system for the linearization of power amplifiers, the system typically contains multiple signal transmission paths, such as a reference path and a feedback path. In a predistortion linearization system, when a signal passes through different signal transmission paths, such as a reference path and a feedback path, the occurrence of a timing difference caused by the distinct signal paths is inevitable. This difference, usually referred to as a time delay, presents significant problems with respect to the accuracy of the predistortion correction. These problems are made worse by the fact that the time delay can vary with environmental conditions including temperature, system conditions including signal power level, system aging, and so on. Therefore, it is difficult to measure in a laboratory such an intrinsic time delay parameter, and, moreover, a parameter for correcting the time-delay cannot be designed as a constant. Many efforts have been made in the prior art to compensate for, reduce or eliminate this time-delay. Traditionally, two methods have been used in prior art predistortion circuits to solve the problem created by the time-delay.

The first is to make a special time-delay cable by measuring and calculating the difference of the same signal passing through different transmission paths so as to compensate the time-delay effect, such as the processing in analog feed-forward predistortion systems. This approach suffers the limitation that the time-delay cable imposes a fixed time-delay that cannot be adjusted despite changes in the signal and environment which naturally occur during the operation of practical systems.

The second is to use a special digital signal processing (DSP) algorithm and circuitry to calculate and adjust adaptively the time difference of the same signal passing through different transmission paths, and then use the resulting time-delay information to correct the non-linearity of power amplifier. This approach is usually implemented in a digital feedback approach and a wireless environment. However, an extra circuit, typically a latch, and an associated algorithm are needed, and the accuracy of the time-delay calculation is also related to the convergence rate of the algorithm.

SUMMARY OF THE INVENTION

Next-generation wireless communication systems will demand improved transmitted signal quality and improved overall RF transmitter system performance for a variety of broadband and multimedia services. These demands upon advanced RF transmitter systems will be satisfied, at least in part, by power amplifiers with higher power efficiency and higher spectrum efficiency than is currently available. In order to get a better predistortion result, the present invention evaluates the time-delay parameter as a variable that is estimated and calculated by a special algorithm and circuitry.

More particularly, the present invention uses, in one implementation, one combined predistortion and time-delay lookup table structure to provide correction factors for both the PA's non-linear distortion and the system's time-delay. This permits the system and method of the present invention to be a self-calibrating solution for performance improvement and nonlinear correction in wireless RF transmitter systems.

This design can be conveniently implemented by an elegantly simple circuit structure and can be used for almost all wireless radio frequency (RF) transmission systems to improve both power efficiency and spectrum efficiency. Examples of some applicable RF transmission systems include wireless base-stations, access points, mobile handsets including but not limited to cellular and GPRS protocols, mobile wireless terminals, portable wireless devices, and other wireless communication systems such as microwave and satellite communications.

The new time-delay invariant method presented herein uses a combination of (i) an adaptive time-delay adjusting methodology to process the PA's nonlinearity, and, at the same time, (ii) time-delay compensation without the additional circuitry and/or an algorithm tailored for the special time-delay adjustment. This novel algorithm-based methodology can be implemented by a predistortion processing unit that includes a time-delay addressing lookup table that can store and memorize the PA's non-linearity, time-delay information and other interference in the system such as noise.

These and other features of the present invention can be better appreciated from the following detailed description, taken in conjunction with the accompanying Figures.

BRIEF DESCRIPTION OF THE DRAWINGS

FIG. 1 illustrates a system and apparatus in accordance with the present invention.

FIG. 2 illustrates in simplified form one implementation for serial addressing of the lookup table as well as the entry of the accumulated history into the lookup table.

FIG. 3 illustrates in simplified form an implementation of parallel addressing of the lookup table, which is otherwise as shown in FIG. 2.

DETAILED DESCRIPTION OF THE INVENTION

In one implementation of the invention, the entries for the lookup table are developed in accordance with the techniques described in pending U.S. patent application Ser. No. 11/262,079, filed Oct. 27, 2005, and U.S. patent application Ser. No. 11/799,239, filed Apr. 30, 2007, both of which are incorporated herein by reference. It will be appreciated by those skilled in the art that the range of errors which occur in a real-world system are bounded; that is, there is a range which has a minimum value and a maximum value, and in all but rare circumstances the correction factor applicable at the time of any given sample will fall within that range. By selecting a lookup table of appropriate size, and populating the lookup table with appropriate values as determined by the methods in the above-mentioned patent, which are selected over the entire operating spectrum of the PA and associated system, the correction factor which is appropriate for each sampling of the input signal will be one of the values already in the lookup table. Thus, once the lookup table has been fully populated, the correction factors of the present invention do not vary with time; that is, they are time-invariant. Although the size of the lookup table can vary significantly with the particular implementation, and could for some systems be as small as sixteen entries, for more complex implementations such as those appropriate for wireless RF transmission systems the table will have on the order of $2^{12}$ entries or more, and may have significantly more entries depending on the permissible power consumption, cost, and related system factors. For certain implementations, a table size between $2^{12}$ and $2^{14}$ entries has been found to be acceptable.

In one implementation, the lookup table of the predistortion processing unit, or predistorter, is addressed by a set of time-related addresses that can be structured by a shift register, although parallel addressing may be implemented in some schemes, as discussed in greater detail hereinafter. For present purposes, the shift register technique will be used for illustration. The addressing of the lookup table is based upon a stored-compensation or memory compensation principle that stores information at different time by a vector form and maps the input vector into one of the entries in the lookup table. The set of addressed entries in the lookup table will result in an output signal that is a mapping function of the corresponding input vector. Due to the input address vector comprising different time signals, the output signal of the lookup table is actually related to the different time information, including the current signal and previous N transmitted signals, where N>1 and N is an integer. As a result, the signal stored in each entry of the lookup table can be considered as a combination of all past transmitted signals rather than the sole response of the current input signal. Typically, the bit length of the address vector in the lookup table determines the duration of time-delay signal to be covered.

In order to correct for the PA's non-linearity in the time-delay environment with a lookup table unit according to the invention, without the use of a latch or other secondary correction circuit, the predistortion algorithm utilizes a function to incorporate the time-delay signal combination. The lookup table stores the non-linear information derived from the PA together with a time-delay factor that is caused by the different signal transmission paths. By appropriately addressing the lookup table in response to a sample, the lookup table provides a correction factor which includes both the appropriate predistortion correction and the appropriate time delay compensation. The output of the lookup table is then combined with the original input signal to provide an input to the PA that results in a linearized output, with substantially no time delay error.

Due to the memory and store function of the lookup table, the non-linear characteristics of the PA that are to be corrected by the lookup table are not limited by the time-based data. The time-independent feature of the lookup table's adaptive processing is one benefit of at least some implementations of the addressing arrangement of the lookup table. The addressing of the lookup table is implemented by a set of N-bit vector data that comprises the current input signal as well as the previous N input signals. Therefore, the address of the lookup table is a combination of series of input sequences with the length of N. The longer the address of the lookup table (and therefore the larger the lookup table), the wider the range of time-delay information that the system can accommodate, i.e. the longer duration of time-delay effects that the system can tolerate. However, while a larger table may permit storage of more information, at some point the entries become repetitive, such that a larger table offers diminishing marginal returns, wastes memory resources, and unnecessarily increases power consumption.

The lookup table of the predistortion processor is based upon the stored-compensation principle that maps a set of input vectors to a real signal output. Since the address of lookup table contains the input information stored from different time, each output signal generated by the lookup table is closely related to the transmitted multi-signals combination. Therefore, based upon the arrangement of the lookup table, the table update entries are also closely related to the combination information of input signals stored from different time points.

Referring next to FIG. 1, an embodiment of the present invention may be appreciated in greater detail. More particularly, the illustrated embodiment includes an Analog Multiplier 11 which receives a modulated RF signal $V_{RF}$ from the RF modulator portion 10 of the base station, and also receives a predistortion correction signal Vp from a lookup table and related components which can be generally described as a predistortion processor, discussed in greater detail below. In general, the predistortion processor can be thought of as all of the components between the ADC's 21 and 25 and the DAC 30. The output of the analog multiplier 11 is provided as the input $V_{in}$ to the power amplifier (PA) 12, which in turn transmits an output signal $V_o$ to an Antenna 13. The RF modulator 10 is typically although not necessarily a quadrature modulator or an orthogonal modulator. It will be appreciated that multiplier 11 can be implemented as multiple multipliers, each associated with one or more quadrature signals.

An input down-converter circuit 20 receives an idealized reference signal $V_{RF}$ from modulator in base station, and is biased by a local oscillator 40, such that it provides an output $V_d$ to an analog-to-digital converter 21. The ADC 21 converts the signal $V_d$ to digital form (as I and Q signals), whereupon it is provided as one input pair to the Digital Predistortion Processor, and more specifically to variables 22I and 22Q, respectively.

A feedback down-converter circuit 26, also biased by a local oscillator 40, receives a raw feedback signal $V_o(t)$ from the output of the PA, and provides a feedback signal $V_f$ to an feedback ADC 25. The digital output of the ADC 25 then provides a second input, i.e. feedback signal, to the Digital Predistortion Processor, and more particularly to variables 24I and 24Q. The Digital Predistortion, discussed in greater detail below, provides a digital output signal $V_r$ to a DAC 30, which converts the digital signal to an analog form, where it is combined with the modulated RF signal in the multiplier 11.

As shown in FIG. 1, address data formers 32I-32Q receive inputs from the ADC 21 I/Q, and are designed to generate the required signal format for a lookup table 33 I/Q. The data formers 32 I/Q address memory units within the lookup tables 33 I/Q, where the lookup table provides separate I and Q outputs to an adder 31. It will be appreciated that the lookup table 33 can be implemented as one or more lookup tables. The address provided by the address formers 32I-32Q can be considered a lookup-table key or address.

The predistortion controller lookup tables 33I-33Q are designed memory units to store the predistortion signal for high power amplifier linearization. The predistortion signals in the tables are based on the error generated by a comparison of the ideal signal $v_d$ and the feedback signal $v_r$ and the presented adaptive algorithm. The data stored in the tables 33 I/Q can be updated by adaptive iteration as described hereinafter, and forms digitally indexed data reflecting the nonlinear characteristics of the power amplifier.

By comparison of AM-AM and AM-PM information between the idealized signal $V_{RF}(t)$ and the feedback signal $V_o(t)$, the Digital Predistortion Processor calculates the error in the amplitude and phase components of the output signal $V_o(t)$ caused by the non-linear transmission characteristics of the high power amplifier 12.

Based on the error information obtained by the foregoing comparison, the predistortion processor, based on the lookup table algorithm disclosed in U.S. Pat. No. 6,985,704, calculates and generates adaptively a compensation signal that is of inverse characteristics with the transform function of the PA 12 to pre-distort the AM-AM and AM-PM distortion caused by the PA 12.

The outputs $v_p$ of the predistortion lookup table 33I-33Q are fed to multiplier 11, after an adder 31 and a digit-to-analog converter 30, to modify the modulated RF signal from modulator 10. The output of the multiplier is the required predistortion signal $V_{in}(k)$ that is of an inverse non-linearity with that of the power amplifier 12 to yield a pre-compensation to the input of high power amplifier.

It will be appreciated by those skilled in the art that there can be a signal difference between two signals, ideal signal $V_{RF}$ and feedback signal, $V_o(t)$, when they arrive at the predistortion controller. The time difference results from the time-delay differences between the two signals, which is caused by the different paths each travels in arriving at the controller. This signal time-delay can vary randomly based on the parameters of the circuits and parts, as well as other environmental factors. The result is that it is difficult to estimate, calculate and adjust for such signal differences in the field application environment. To overcome this issue, the present invention adaptively adjusts for this time-delay through the use of an algorithm taught by the previously cited U.S. Pat. No. 6,985,704.

The use of the look-up tables 33 permits a memory function to be introduced into at least some embodiments of the present invention. The lookup table of the predistortion controller is based on a stored compensation principle that maps a set of input data into a digital output, and updated adaptively. Based on the stored function, each output signal of lookup table is actually related to both the current and the previously transmitted signal, and therefore has a memory function which compensate not only for the non-linearity of the PA, but also avoids the need for a special time-delay compensation circuit such as typically used in the prior art.

Based on the predistortion architecture shown in FIG. 1, the non-linearity of power amplifier is corrected by the output signal $v_p$ of predistortion processor. The signal $v_p$ is multiplied with the modulated RF signal to generate the predistorted signal as the input of power amplifier. Actually, the input signal of power amplifier is a complex gain signal that can be controllable in the amplitude/envelope and be adjustable in phase. The relation of the input and output can be described as the following complex gain expression $$v_{in}=v_{RF}v_p=v_{RF}F(V) \qquad (1)$$

where $v_p$ is the output of predistortion processor generated by a mapping function F of lookup table. Usually, the mapping function F is unknown and is difficult to express mathematically. However, F may be determined adaptively by updating the entries in the lookup table in accordance with the adaptive algorithm to realize all possible mapping that corresponds to the relations with $$\{0,1\}^N \rightarrow v_p.$$

The lookup table therefore maps each set of N-bit input address vector V to a real output $v_p$. In fact, the N-dimensional address vector represents the transmitted signal sequences going through power amplifier from the current time though previous N time, expressed by $$V(k)=(d_1(k),d_2(k),\ldots,d_N(k))^T \qquad (2)$$

where each data $d_i$ in above vector V is either 1 or 0, expressed as $$d_i(k)=0 \text{ or } 1 \text{ for } 1\le i\le N \qquad (3)$$

In one implementation, shown in FIG. 2, the address of the lookup table 200 is formed by a serial shift register 205 that addresses each corresponding entry of the lookup table during the predistortion processes. Due to the addressed information being related to the current and previous N transmitted signal, the output signal 210 of the lookup table can be considered as a function of the last N transmitted data, and therefore incorporates a time delay correction element. The lookup table is adaptively updated by combining the adaptive error 215 and a table update 220 in combiner 225. The arrangement of the lookup table, configured as a predistortion processor, can systematically utilize the combined correction signal for the processing of both non-linearity correction of PA and time-delay compensation, even if time-delay effects are present when the same signal passes through different transmission paths.

The technique of using a lookup table having combined predistortion and time-delay correction makes unnecessary the use of additional time-delay processing and related circuitries. Since the address of the lookup table contains the current and previous transmitted correction information, each output signal from the lookup table is inherently a multi-time information combination that contains rich signal components from the current time to the previous N-time. As a result, the predistortion algorithm has a built-in mechanism to compensate for signal-delay effects. This results in a predistortion processing structure that is significantly simpler, and more effective than traditional solutions.

In a predistortion architecture with the lookup table as shown in FIGS. 1 and 2, the memory table is addressed by its address register. The bit-number length of shift register determines the size of lookup table and therefore the covered time-delay range, i.e., the maximum limit of time-delay effects. Each set of data stored in a lookup table entry has a unique address index. This address index of a data set corresponds to the data set's sampled time point of the input signal. The address indices are then utilized as time stamps for time calibration purpose of PA's non-linear error correction calculations. In other words, at each predistortion calculation time point, the predistortion algorithm selects only one set of data from a specific addressed entry as the output of the lookup table for further PA's non-linearity error correction processing. If the selected output signal is only related to the current-time transmitted signal without any relation with other transmitted signal, then the time-delay, caused by the current transmitted signal passing through different transmission paths, must be considered during the predistortion processing in order to provide an accurate signal matching between the reference and feedback signal.

The time-delay range to be covered by lookup table is related to the bit number of the address register. For a lookup table with an N-bit address register, the size of lookup table entries is $M=2^{N-1}$. This means that there are M entries in the lookup table, and all the data stored in the entries are the functions of address vectors that cover the current time k to previous k−M+1 time. The set of input address vectors, A, can be expressed as $$A=\{V(k),V(k-1),\ldots,V(k-M+1)\} \quad (4)$$

where V(k) is an input address vector at time k, which records M possible predistorted information to PA nonlinearity and each information recoded the current transmitted signal and the time-delay signal components.

Based on the memory-compensation principle, the combined time-delay lookup table structure involves simple logic operations and signal processing to capture the time-delay of signal passing through different transmission paths. More specifically, due to the time-delay invariant characteristic, this predistortion architecture can process and correct PA non-linearities in a wider dynamic range and without the needs of additional circuitries and algorithms.

It will also be appreciated by those skilled in the art that, for some embodiments, typically those with larger lookup tables and relatively high sampling rates, a parallel addressing scheme can be used, such as that shown in FIG. 3, which is essentially identical to FIG. 2 except for the use of a parallel input 300 to the lookup table. If the sampled data points are taken close together (i.e., a comparatively fast sampling rate) so that the correction factors for sample t and sample t+1 effectively become identical, then we can use the parallel addressing approach to address the lookup table. In some embodiments, if the size of the lookup table is sufficiently large, and computing power and other device issues are satisfied, then the parallel addressing approach can offer better performance over a serial addressing approach in environments which use a very fast sampling rate.

Having fully described the invention in detail in detail, including several embodiments and alternatives, those skilled in the art will appreciate that numerous other alternatives and equivalents exist which are within the scope of the present invention. Therefore the invention is intended not to be limited by the above description, but rather only by the appended claims.

What is claimed is:

1. A predistortion system for linearizing the output of a power amplifier, the predistortion system comprising:
   a first receiver configured to receive a first signal representative of a radio frequency (RF) modulated signal;
   a second receiver configured to receive a feedback signal representative of at least one nonlinear characteristic of the power amplifier; and
   a predistortion controller communicatively coupled with both the first receiver and the second receiver, wherein the predistortion controller comprises at least one lookup table of a predetermined size, and wherein an output of the lookup table includes a time delay correction element.

2. The predistortion system of claim 1 wherein the inputs are further derived from a difference between the square of a quadrature component of the first signal and the square of a quadrature component of the feedback signal.

3. The predistortion system of claim 1 wherein the inputs are further derived from a difference between the square of an in-phase component of the first signal and the square of an in-phase component of the feedback signal.

4. The predistortion system of claim 1, further comprising a reference path communicatively coupled with the first receiver and the predistortion controller.

5. The predistortion system of claim 4, further comprising a feedback path communicatively coupled with the second receiver and the predistortion controller.

6. The predistortion system of claim 5 wherein the at least one lookup table is configured to store at least one time-delay value that compensates for a time delay between the reference path and the feedback path.

7. The predistortion system of claim 6 wherein the at least one lookup table is further configured to adaptively update at least one correction value in the lookup table by combining a non-linear correction value of the power amplifier with the at least one time-delay value.

8. The predistortion system of claim 1 wherein the predistortion controller is configured to generate a correction factor for correcting at least one nonlinear characteristic of the power amplifier based on at least an input of the lookup table.

9. The predistortion system of claim 8, further comprising a processor configured to combine the RF modulated signal with a second signal corresponding to the correction factor.

10. The predistortion system of claim 9 wherein the processor is further configured to supply the combined RF modulated signal with the feedback signal to the power amplifier to linearize the output of the power amplifier.

11. The predistortion system of claim 8, further comprising combining logic to combine the RF modulated signal with a signal corresponding to the correction factor.

12. The predistortion system of claim 11 wherein combining logic is performed to also supply the combined RF modulated signal and feedback signal to the power amplifier to linearize the output of the power amplifier.

13. The predistortion system of claim 1, further comprising a serial shift register for forming an address for the lookup table.

14. The predistortion system of claim 1 wherein the lookup table is addressed by parallel signals.

15. The predistortion system of claim 1 wherein the feedback signal is an analog signal.

16. The predistortion system of claim 15, further comprising a digital-to-analog converter.

17. The predistortion system of claim 16 wherein the digital-to-analog converter is configured to convert a digital signal corresponding to a correction factor of the feedback signal.

18. The predistortion system of claim 1 wherein the lookup table comprises at least one correction value.

19. The predistortion system of claim 18 wherein the at least one correction value falls within a range determined by the predetermined size of the lookup table.

20. The predistortion system of claim 1 wherein the lookup table is configured to respond to inputs derived from outputs of the at least one lookup table.

\* \* \* \* \*